United States Patent
Brennan

(10) Patent No.: US 7,332,976 B1
(45) Date of Patent: Feb. 19, 2008

(54) POLY-PHASE FREQUENCY SYNTHESIS OSCILLATOR

(75) Inventor: Aaron Brennan, Moscow, ID (US)

(73) Assignee: Cypress Semiconductor Corporation, San Jose, CA (US)

( * ) Notice: Subject to any disclaimer, the term of this patent is extended or adjusted under 35 U.S.C. 154(b) by 3 days.

(21) Appl. No.: 11/347,189

(22) Filed: Feb. 3, 2006

Related U.S. Application Data

(60) Provisional application No. 60/650,057, filed on Feb. 4, 2005.

(51) Int. Cl.
*H03B 5/36* (2006.01)
(52) U.S. Cl. ......................................... 331/45; 333/172
(58) Field of Classification Search .................... 331/45
See application file for complete search history.

(56) References Cited

U.S. PATENT DOCUMENTS

| | | | |
|---|---|---|---|
| 3,530,365 A * | 9/1970 | Peugh | ......................... 363/149 |
| 5,355,097 A | 10/1994 | Scott | |
| 5,373,260 A * | 12/1994 | Kato | ........................... 331/45 |
| 5,581,216 A | 12/1996 | Ruetz | |
| 5,748,048 A | 5/1998 | Moyal | |
| 5,896,069 A | 4/1999 | Williams | |
| 6,104,257 A | 8/2000 | Mann | |
| 6,140,880 A | 10/2000 | Moyal | |
| 6,177,843 B1 | 1/2001 | Chou | |
| 6,198,360 B1 | 3/2001 | Henrion | |
| 6,275,116 B1 | 8/2001 | Abugharbieh | |
| 6,275,117 B1 | 8/2001 | Abugharbieh | |
| 6,294,962 B1 | 9/2001 | Mar | |
| 6,326,853 B1 | 12/2001 | Moyal | |
| 6,388,479 B1 | 5/2002 | Gupta | |
| 6,388,543 B1 * | 5/2002 | Molnar et al. | .............. 333/172 |
| 6,404,294 B1 | 6/2002 | Sha | |
| 6,407,641 B1 | 6/2002 | Williams | |
| 6,515,551 B1 | 2/2003 | Mar | |
| 6,525,616 B1 | 2/2003 | Williams | |
| 6,529,100 B1 * | 3/2003 | Okanobu | .................... 333/172 |
| 6,563,390 B1 | 5/2003 | Kizziar | |
| 6,563,391 B1 | 5/2003 | Mar | |
| 6,657,501 B1 | 12/2003 | Anil | |
| 6,657,506 B1 | 12/2003 | Maheshwari | |
| 6,667,668 B1 | 12/2003 | Henrion | |
| 6,670,852 B1 | 12/2003 | Hauck | |
| 6,690,243 B1 | 2/2004 | Henrion | |
| 6,771,136 B1 | 8/2004 | Reynolds | |
| 6,825,728 B1 | 11/2004 | Beard | |
| 6,836,180 B1 * | 12/2004 | Kwok | ........................ 327/552 |
| 7,005,933 B1 | 2/2006 | Shutt | |

* cited by examiner

*Primary Examiner*—Joseph Chang
(74) *Attorney, Agent, or Firm*—Brownstein Hyatt Farber Schreck, P.C.

(57) ABSTRACT

A frequency synthesis/multiplication circuit and method for multiplying the frequency of a reference signal. In one embodiment, multiple versions of the reference signal are generated having different phases relative to one another, and these multiple versions are combined to form an output signal having a frequency that is a multiple of the frequency of the reference signal.

20 Claims, 5 Drawing Sheets

POLY-PHASE FREQUENCY SYNTHESIS OSCILLATOR

CROSS REFERENCE TO RELATED APPLICATION

This application claims priority under 35 U.S.C. 119(e) to U.S. Provisional Patent Application No. 60/650,057 entitled "POLY-PHASE FREQUENCY SYNTHESIS OSCILLATOR" filed Feb. 4, 2005, the disclosure of which is hereby incorporated by reference in its entirety.

FIELD OF THE INVENTION

The present invention relates generally to electronic circuits, and more particularly to oscillator circuits or clock circuits.

BACKGROUND OF THE INVENTION

Phase lock loop (PLL) circuits are typically used to provide or generate a clock signal that is an integer fraction or integer multiple of a crystal oscillator reference frequency.

FIG. 1 illustrates a conventional phase lock loop architecture. A reference clock 22 generates a reference clock signal having a reference frequency, and the reference clock signal may be coupled with a phase/frequency detector 24 which may be coupled with a low pass filter 26. The output of the low pass filter 26, which is typically a voltage that is proportional to the reference frequency of the clock signal, is coupled with a voltage controlled oscillator 28. The output of VCO 28 can be fed back and divided down in frequency (by M) by feedback divider 30 which provides a divided down feedback signal to the phase/frequency detector 24. The output of the voltage controlled oscillator is an oscillating signal which may be divided down (by N) in frequency by divider 32 in order to provide an oscillating signal having an output frequency.

The dividers 30, 32 are arranged to multiply or divide an circuit's reference frequency. In this way, a phase lock loop 20 can provide a wide range of output frequencies derived from the reference clock. The output frequency of a conventional crystal oscillator and PLL circuit, such as in FIG. 1, is shown in Equation 1.

$$f_{Out} = \frac{M}{N} f_{Ref} \quad \text{(Equation 1)}$$

In Equation 1, $f_{Out}$ is the frequency of the output clock from divider 32 and $f_{Ref}$ is the frequency of the input reference clock 22.

While a conventional phase locked loop 20 provides a wide range of flexibility in design for use in circuit applications that have different frequency requirements, a conventional phase lock loop circuit can consume a large amount of area on an integrated circuit and may also utilize significant amounts of power.

As recognized by the present inventor, it would be desirable to have a solution that can provide frequency multiplication of a reference clock frequency using a circuit that is small and requires low power when compared with a conventional phase lock loop circuit.

Accordingly, as recognized by the present inventor, what is needed is a frequency multiplication circuit that can provide an alternative design to a conventional phase lock loop circuit.

It is against this background that various embodiments of the present invention were developed.

SUMMARY

In light of the above and according to one broad aspect of one embodiment of the present invention, disclosed herein is a circuit that may comprise a reference clock providing a reference clock signal operating at a reference frequency; and a poly-phase frequency multiplier coupled with the reference clock signal, the poly-phase frequency multiplier providing an output signal with a frequency that is a multiple of the reference frequency, the poly-phase frequency multiplier having an input bias stage, a poly-phase filter stage, and a logic stage. The reference clock signal is a sinusoidal signal that may be a differential signal or a single-ended signal.

In one example, the input bias stage includes at least one coupling capacitor for receiving the reference clock signal. The input bias stage may have at least one resistor divider for offsetting the reference clock signal to a DC offset level.

In one embodiment, the poly-phase filter stage includes a first stage for generating at least two signals from the reference clock signal, the at least two signals including a first signal that is derived from the reference clock signal, and a second signal that is derived from reference clock signal and is shifted in phase by a first amount relative to the first signal. In one example, the at least two signals may include a third signal that is derived from the reference clock signal and is shifted in phase by a second amount relative to the first signal, and a fourth signal that is derived from the reference clock signal and is shifted in phase by a third amount relative to the first signal. In one embodiment, the poly-phase filter stage includes a second stage for further filtering the at least two signals of the first poly-phase filter stage. The logic stage can include one or more exclusive-OR gates.

If desired, the circuit may also include a frequency divider receiving the output signal of the poly-phase frequency multiplier and providing a divided signal output having a frequency that is a fraction of the frequency of the output signal.

According to another broad aspect of another embodiment of the present invention, disclosed herein a circuit for multiplying a frequency of a reference signal. In one example, the circuit may include an input bias stage coupled with the reference signal and generating a biased reference signal; a filter stage receiving the biased reference signal, the filter stage generating a plurality of delayed signals derived from the reference signal; and a logic stage receiving the plurality of delayed signals and generating an output signal having a frequency that is a multiple of the frequency of the reference signal. In one example, the reference signal may be a differential sinusoidal signal.

In one embodiment, the input bias stage includes at least one coupling capacitor for receiving the reference signal, and the input bias stage may have at least one resistor divider for offsetting the reference signal to a DC offset level.

In one embodiment, the filter stage may include a first filter stage for generating at least two signals from the reference signal, the at least two signals including a first signal that is derived from the reference signal, and a second signal that is derived from reference signal and is shifted in phase by a first amount relative to the first signal. The at least two signals may include a third signal that is derived from the reference signal and is shifted in phase by a second amount relative to the first signal, and a fourth signal that is derived from the reference signal and is shifted in phase by a third amount relative to the first signal. The filter stage may also include a second filter stage for further filtering the at least two signals of the first filter stage. The logic stage may include one or more exclusive-OR gates. If desired, the circuit may also include a frequency divider receiving the output signal of the poly-phase frequency multiplier and providing a divided signal output having a frequency that is a fraction of the frequency of the output signal.

According to another broad aspect of another embodiment of the present invention, disclosed herein a method for multiplying a frequency of a reference signal. In one example, the method may include the operations of generating multiple versions of the reference signal having phase offsets from one another, and combining the versions of the signal to form an output signal having a frequency that is a multiple of the frequency of the reference signal.

The features, utilities and advantages of the various embodiments of the invention will be apparent from the following more particular description of embodiments of the invention as illustrated in the accompanying drawings.

DETAILED DESCRIPTION

Disclosed herein are various embodiments of a circuit and method for multiplying the frequency of a reference clock to generate an output signal that has a frequency that is a multiple of the reference clock frequency. Embodiments of the present invention may be used, for instance, to generate an output clock signal that has a frequency that is, for example, a small integer value multiple of the frequency of the reference signal. Embodiments of the present invention may be implemented so as to provide a low power and area efficient alternative to a conventional phase locked loop solution.

In one example of the present invention, a circuit may comprise a crystal oscillator or other conventional clock generation circuit that produces a differential sinusoidal reference clock; a multi-stage poly-phase filter for generating multiple phases (or delayed versions) of the reference signal; and logic, such as combinatorial logic gates such as a differential XOR gate, that combines the multiple phase signals to produce an output signal that has a frequency that is a multiple of the reference signal. For instance in FIG. 2, the circuit is designed to produce an output signal that has a frequency that is twice the frequency of the reference signal. Various embodiments of the present invention are described herein.

Figure 1:
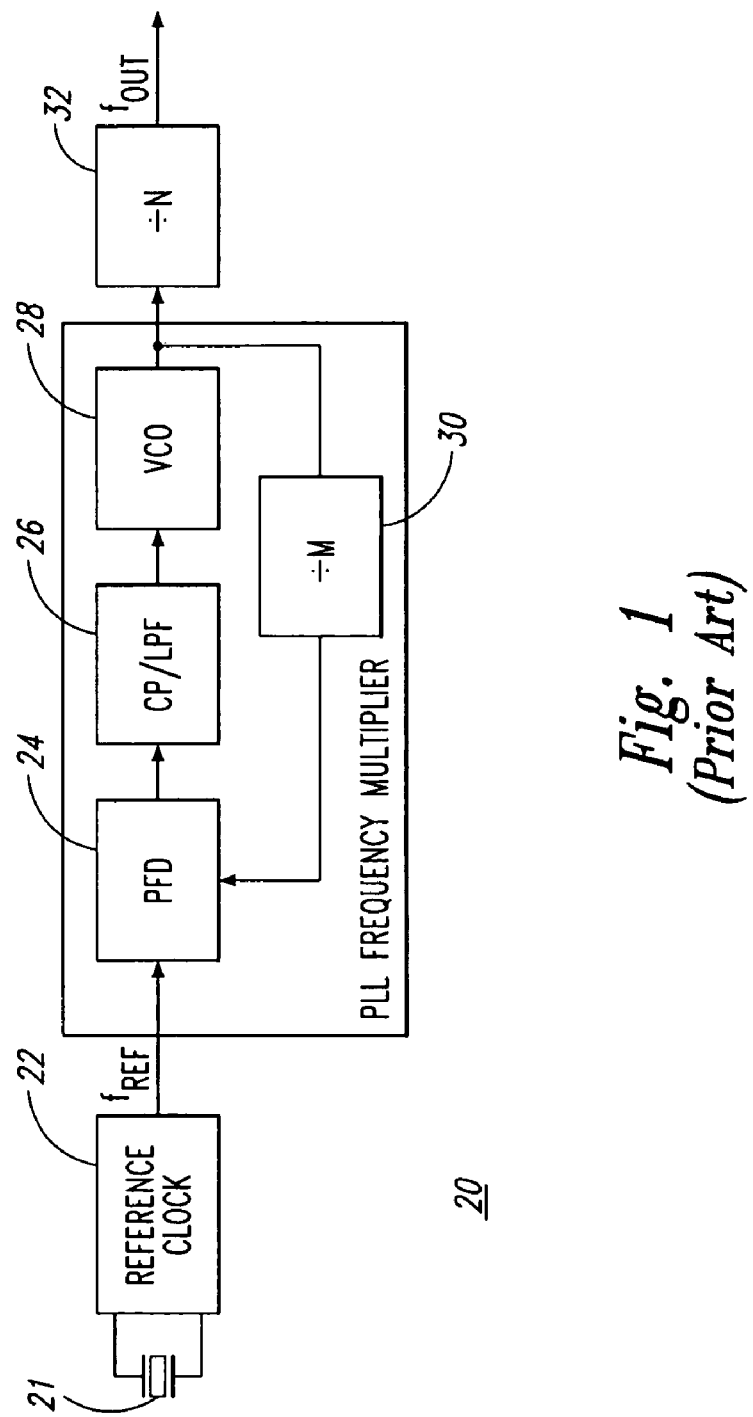
FIG. 1 illustrates a schematic diagram of a conventional phase lock loop circuit for generating a clock signal having an output frequency signal.
Figure 2:
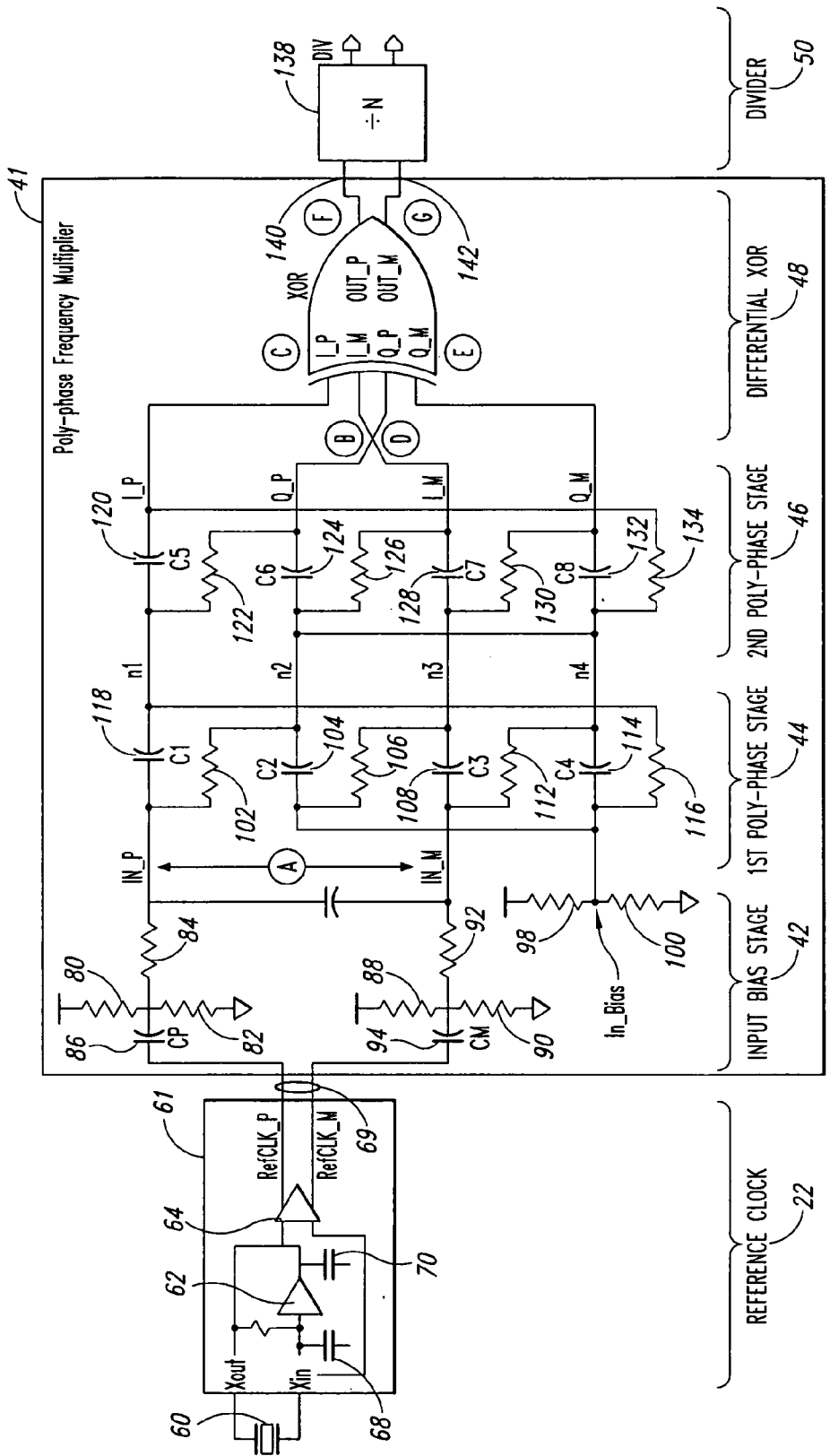
FIG. 2 illustrates a block diagram of an frequency multiplication circuit in accordance with an embodiment of the present invention.

In one example, a poly-phase filter may be tuned to the reference clock frequency that produces 2*M outputs separated by 360/(2*M) degrees. In the example of FIG. 2, the poly-phase stages produce 4 signals of different phases (or delays), a first signal (I_P) that is delayed version of the reference frequency signal 69, a second signal (Q_P) that is 90 degrees out-of-phase with the first signal (I_P), a third signal (I_M) that is 180 degrees out-of-phase with the first signal (I_P), and a fourth signal (Q_M) that is 270 degrees out-of-phase with the first signal (I_P).

The multiple phases may be combined using combinatorial logic (such as multiple differential XOR logic circuits) to create a square wave output signal having a frequency of M times the reference frequency. A frequency divider (optional) may be used, if desired, to further divide the output signal (i.e., a divider configurable to divide by an integer N).

A frequency divider may be used in conjunction with embodiments of the present invention in order to divide the multiplied clock signal by some value that in one embodiment is configurable by the user.

The architecture of FIG. 2 can be used to synthesize a clock frequency with possibly less area, lower power, and lower phase noise when compared with a conventional phase lock loop.

In one example, a poly-phase filter derives multiple output phases from a differential sinusoidal reference clock. The reference clock may be AC coupled at the input of the poly-phase filter (shown as signal A in FIGS. 2-3 which is comprised of the signal IN_P and the signal IN_M). The resistors 80, 82 and 88, 90 and 98, 100 between supply and ground can be matched to provide a consistent DC bias at all four phases of the first stage 42 of the poly-phase filter.

The resistor-capacitor (RC) time constant of each poly-phase filter stage is tuned to a frequency near the output frequency of the crystal oscillator ($f_{Ref}$), in one example. The number of poly-phase filter stages can be determined by calculation or simulation to provide the desired frequency multiplication performance. Factors in determining the number of phases can include the frequency range to be covered, the accuracy of the phase separation, the matching between poly-phase filter elements, and losses through the filter which are compensated by the differential XOR logic block. The number of stages may also determined by the number of phases desired at the output of the poly-phase filter.

After passing through a number of stages, the multiple phases of the reference signal are available. In the example shown in FIGS. 2-3, four phases are available with each phase separated by 90° (shown as signals B and D). The input stage of the differential XOR gate will internally convert the sinusoids into square waves (shown as C and E in FIGS. 2-3) of the same frequency and phase through a combination of gain and amplifier saturation. The C signal is the 0° phase, and the E signal is the 90° phase. The XOR logic combination of these two signals provides the differential output signal F (and G which is the complement of F) that are at twice the frequency of the input signal A. Hence, the differential signals F and G are each operating at a frequency of twice the frequency of the reference signal, in this example.

Figure 3:
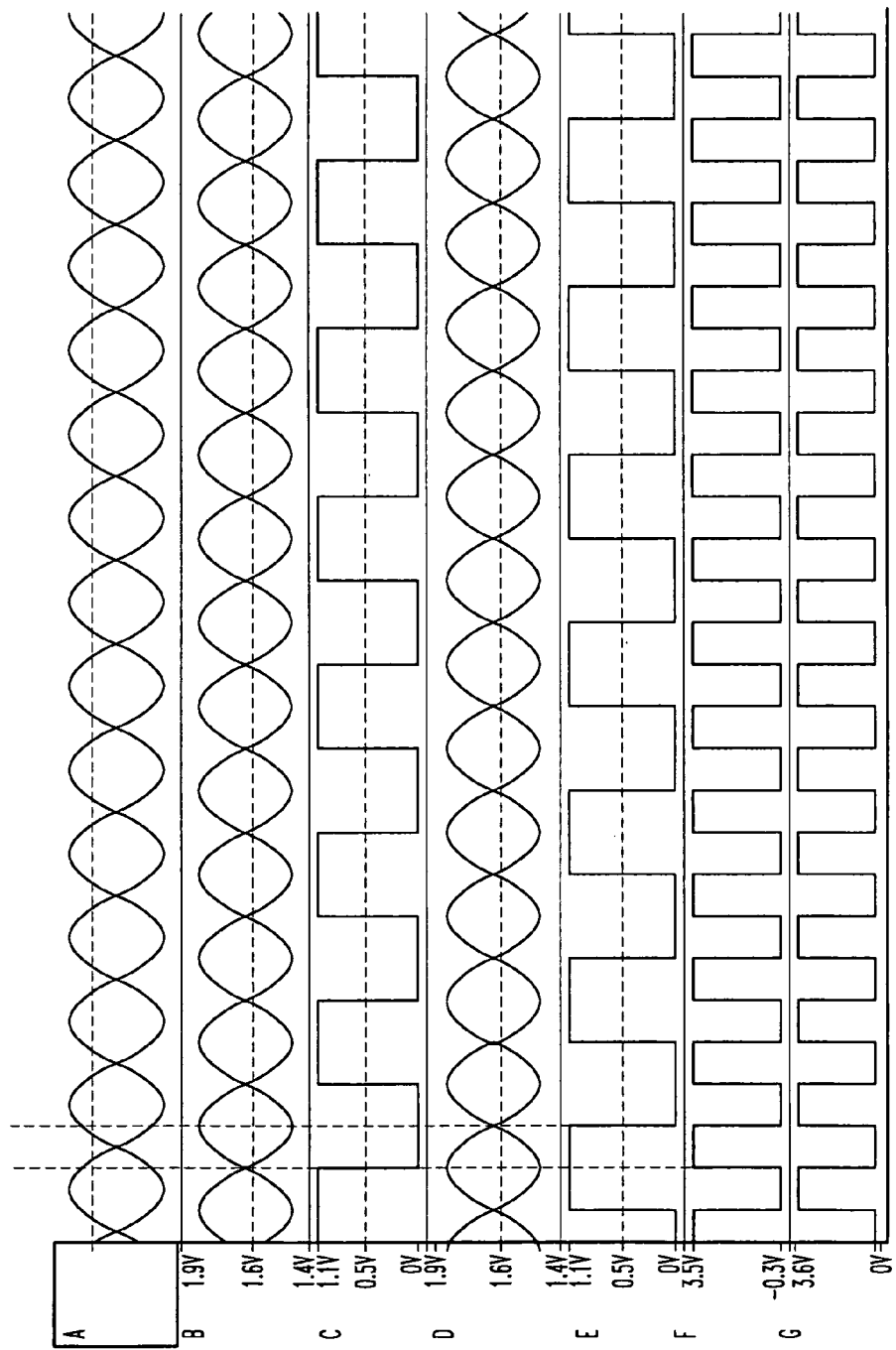
FIG. 3 illustrates an example of waveforms corresponding to various points in the frequency multiplication circuit of FIG. 2, in accordance with an embodiment of the present invention.

Stated differently, in one example and as shown in FIGS. 2-3, the signal I_P is derived from the input reference signal 69. The signal Q_P is derived from the input reference signal 69 and is 90 degrees offset or out-of-phase from the I_P signal. The signal I_M is derived from the input reference signal 69 and is 180 degrees offset or out-of-phase from the I_P signal. The signal Q_M is derived from the input reference signal 69 and is 270 degrees offset or out-of-phase from the I_P signal. Stated differently, in one example each of the signals derived from the reference signal are 90 degrees out of phase from one of the other derived signals.

In FIGS. 2-3 and in one example, the signals I_P and I_M (the positive and negative versions of signal B) are processed by the front end of gate 136 (such as internally within gate 136 by a comparator or like structure therein) to form square wave C. The signals Q_P and Q_M (the positive and negative versions of signal D) are processed by the front end of the gate 136 (such as internally by a comparator or like structure) to form square wave E. Signals C and E are logically processed by the XOR logic gate 136 to form the output F (140) and its complement G (142). It can be seen in FIG. 3 that the differential signal F, G may be characterized as being a clock signal operating at twice the frequency than the frequency of the input reference signal, in this example.

Specifically, FIG. 2 illustrates an example of a circuit for providing an oscillating clock signal that has a frequency that is a multiple of the frequency of an input reference signal, in accordance with one embodiment of the present invention. Generally, circuit 40 may include a reference clock providing a reference clock signal, and a poly-phase frequency multiplier circuit section 41. In one example, the poly-phase frequency multiplier 41 includes circuit elements 42, 44, 46 for generating or deriving multiple phases or delays of the reference clock signal, and combining these phases with logic 48 in order to increase the effective frequency of the output clock signal. In one example, the logic 48 includes an exclusive-or function (XOR). The output of a frequency multiplier circuit section 41 may be coupled with a conventional divider 50, if desired, depending upon the implementation. For example, a poly phase frequency multiplier 41 in accordance with an embodiment of the present invention may be used to multiply an input reference clock frequency by 2, 4, or other multiples depending upon the implementation.

In one example, a circuit 40 may include a reference clock 22 (which may be implemented using any conventional design for generating a periodic reference signal), a frequency multiplier 41 which generates multiple phases of the reference signal and includes logic 48 for using the multiple phases in order to create a periodic signal having a higher frequency than the reference signal 22.

In one example, reference clock 22 may be implemented utilizing any conventional circuit or methodology for generating a reference signal which is periodic in having a reference frequency. For purposes of illustration only, FIG. 2 includes an example of a reference clock circuit 61 which may be coupled with a crystal 60 for generating a reference clock signal output 69. In one example, the reference clock output 69 may be implemented as a differential signal, or alternatively may be implemented as a single ended signal if desired. In one example, circuit 61 may include a resistor 66 and capacitor 68 in series, forming a node there between which is coupled with amplifier/comparator 62. The output of amplifier 62 may be coupled with the input to the amplifier through resistor 66. The output of amplifier 62 may be also coupled with an input of differential amplifier 64. Another input of differential amplifier 64 may be coupled with one end of the crystal 60, and the other end of the crystal 60 may be coupled with the output of amplifier 62.

A capacitor 70 may be coupled with the output of amplifier 62 and connected with ground if desired.

In one example, frequency multiplier 41 may include a circuit having multiple stages therein. These stages may include an input by a stage 42, one or more stages 44, 46 that generate multiple phases or delays from the input reference signal, and a logic stage 48 that combines the phases generated by stages 44, 46 in a manner that effectively multiplies the frequency of the referenced signal 69.

In one example, input bias stage 42 receives a differential reference signal 69 from reference clock circuit 22 through a set of coupling capacitors 86, 94. Coupling capacitor 86 is also coupled with a resistor network 80, 82, 84; coupling capacitor 94 is coupled with a resistor network of resistors 88, 90, 92. A capacitor 96 is coupled between the outputs of resistors 84, 92. In one example, resistors 80, 82, and 84 are coupled together at a node, wherein resistor 80 is pulled up to a supply voltage and resistor 82 is coupled with ground. Likewise, resistors 88, 90, and 92 are coupled at a node, with resistor 88 coupled with a voltage supply and resistor 90 coupled with ground.

The output signal from resistor 84 of the input bias stage 42 is labeled IN_P, and the output signal from resistor 92 of input bias stage 42 is labeled IN_M, and the signal across these two points is shown as signal A (see also FIG. 3). In one embodiment, a DC voltage at node IN_BIAS is generated through a resistor divider 98, 100, and the divided voltage is utilized within the first poly phase stage 44.

In one example, a frequency multiplier 41 may include a first stage 44 and second stage 46 which generate different phases from the received referenced signal 69. The first stage 44 may receive, as shown in FIG. 2, the signals IN_P and IN_M (shown as signals A). In one example, the signal IN_P has two phases and n1, n2 generated therefrom. IN_P is coupled through capacitor 118 to the n1 node. The signal IN_P is coupled through resistor 102 to the n2 node. Capacitor 104 is coupled from the n2 node through resistor 106 to the n3 node. The n3 node is coupled to the signal IN_M through capacitor 108. The n4 node is also coupled with the signal IN_M through resistor 112. The node n4 is coupled through capacitor 114 and resistor 116 to the n1 node. The n4 node is also coupled through capacitor 114 to the IN_BIAS node (resistor divider formed by resistors 98, 100).

The second poly-phase stage 46 receives the signals at nodes n1, n2, n3, n4. Stage 46 provides signals I_P, Q_P, I_M, Q_M (which are shown as signal B, D, also shown in FIG. 3). The n1 node is coupled through capacitor 120 to the I_P node. The n2 node is coupled through capacitor 124 to the Q_P node. The n3 node is coupled through capacitor 128 to the I_M node. Node n4 is coupled through capacitor 132 to the Q_M node. The n1 node is coupled to the Q_P node through resistor 122. The n2 node is coupled to the I_M node through resistor 126. The n3 node is coupled with the Q_M node through resistor 130. The n4 node is coupled with the I_P node through resistor 134.

The signals I_P, Q_P, I_M, Q_M are fed into logic 48, which in this example is implemented as a differential exclusive-OR gate 136. In one example, the differential signal pair I_P and I_M are processed with the differential signal pair Q_P and Q_M are processed by a differential XOR logic gate to form the differential output pair Out_P and Out_M. In another example, the differential signals are processed by a pseudo-differential logic circuit to form the output. A single-ended two-input logic gate may process the signals I_P and Q_P to form the output signal Out_P. In addition, a single-ended two-input logic gate may process the signals I_M and Q_M to form the output signal Out_M.

Divider 50 (also shown as 138) may be utilized, if desired, depending upon the particular implementation. Divider 50 may be implemented utilized using any conventional signal frequency divider.

It is also possible to use a differential to single-ended conversion on the differential signal pair I_P and I_M and another differential to single-ended conversion on the differential signal pair Q_P and Q_M so that the combining of clock phases can be accomplished using a single-ended logic circuit.

Figure 4:
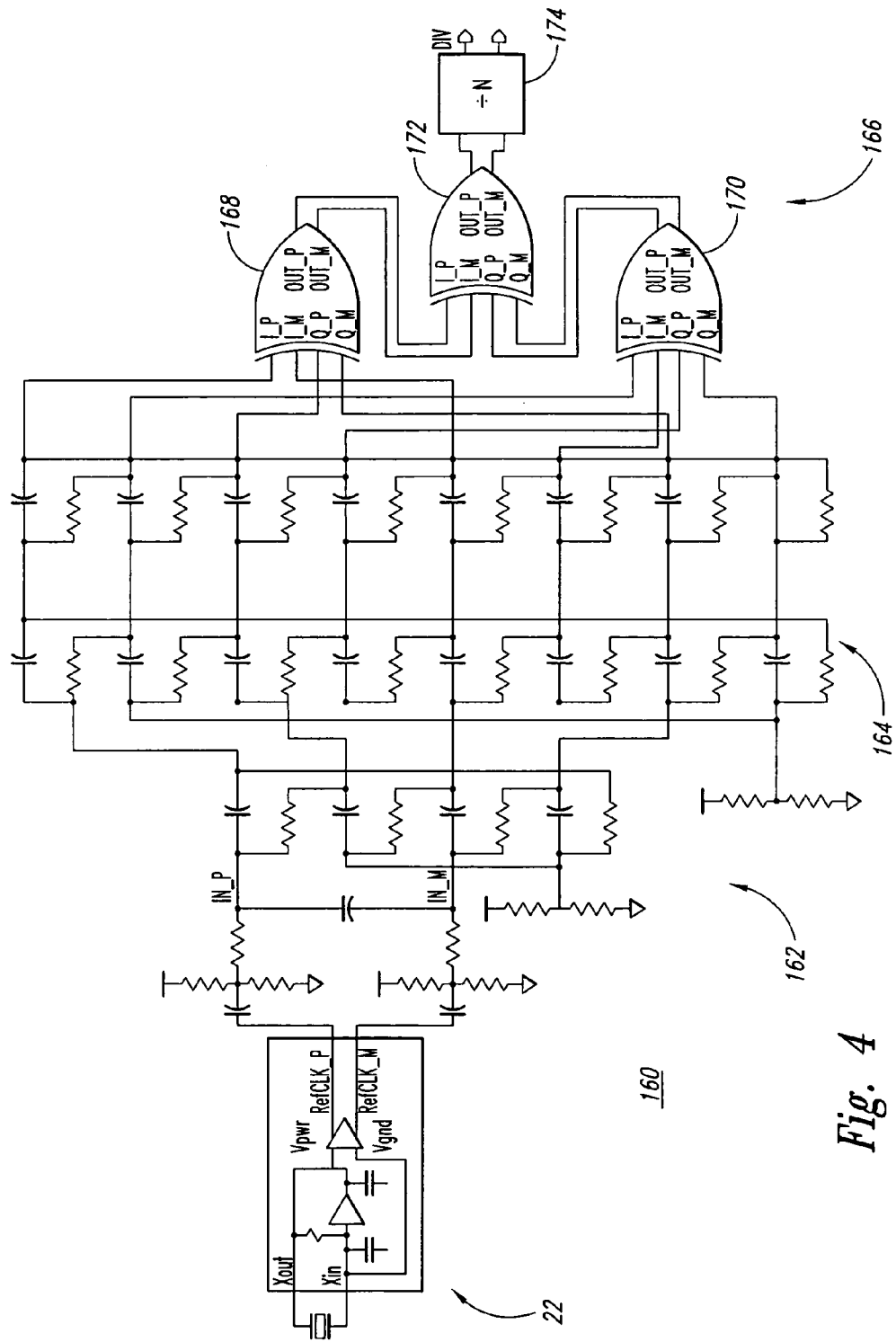
FIG. 4 illustrates another example of a frequency multiplication circuit, in accordance with an embodiment of the present invention.

In another embodiment, such as the circuit 160 shown in FIG. 4, multiplication factors other than 2× can be achieved by providing a longer chain of resistors and capacitors at each stage. The first poly-phase stage 162 creates four phases from the differential reference clock. The second poly-phase stage 164 creates eight clock phases from the output of the first poly-phase stage. Logic 166, implemented in this example as cascaded XOR structures 168, 170, 172, processes the 8 poly-phase signals. A divider 174 may be used, if desired, to divide the frequency of the output signal.

While FIG. 2 shows an embodiment where a circuit creates 4 phases of the reference clock signal and FIG. 4 shows an embodiment where a circuit creates 8 phases of the reference clock signal, other numbers of phases could be used in other implementations.

In one embodiment, a differential to single-ended conversion circuit (as is well known in the art) can optionally be used at the output of the differential divider. Or, in another embodiment, a differential to single-ended conversion circuit (as is well known in the art) may be used before the divider to allow use of a single-ended divider circuit.

In another embodiment, if a multiply by 2 and divide by 2 structure circuit is desired wherein a poly-phase filter is configured to produce four output phases separated by 90 degrees, from which the XOR logic creates a clock signal whose frequency is twice the reference clock frequency, the duty cycle of the reference clock can be eliminated by a divider on the output since the divider may be triggered off one clock edge and ignores the other clock edge. Used in this mode, a circuit can restore a reference clock with a poor duty cycle, to 50% duty cycle if the divider is set to divide by two. A clock signal with a 50% duty cycle is desirable because it can provide additional timing margin in digital circuits that are triggered off both clock edges.

Figure 5:
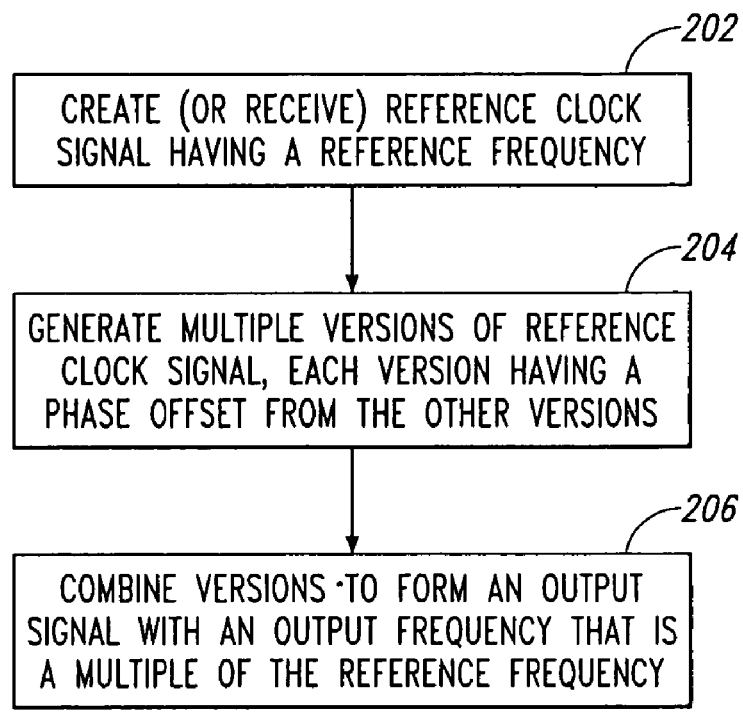
FIG. 5 illustrates an example of operations for generating an output signal having a frequency that is a multiple of the frequency of a reference signal, in accordance with one embodiment of the present invention.

FIG. 5 illustrates an example of operations for creating a clock output signal that has a frequency that is a multiple of the frequency of a reference clock signal, in accordance with one embodiment of the present invention. At operation 202, a reference clock signal having a reference frequency is created or received. Operation 202 may be implemented using any convention processes or circuits for generating a reference clock signal. In one example, the reference clock signal is a sinusoidal clock signal, although other clock signal types may be used depending upon the implementation.

At operation 204, multiple phases or delays of the reference clock signal are generated. In one example, four phases of a reference signal are created. In another example, eight phases or more of a reference clock signal are created, depending upon the implementation. The different phases of the reference signal may also be characterized as delayed versions of the reference signals, each delayed version being delayed a different amount from the reference signal.

At operation 206, the signals of different phases/delay of operation 204 are combined to form an output signal having an output frequency that is a multiple of the frequency of the reference signal. In one example, the signals of different phases/delays are combined using combinatorial logic. In one example, one or more XOR gates are used to combine the different phases in order to produce an output signal having an output frequency that is a multiple of the frequency of the reference signal. If desired, the output signal can be further manipulated by additional conventional operations, such as frequency dividers may be used to divide the output signal of operation 206 by a desired value.

Advantages of embodiments of the present invention include replacing a conventional phase lock loop with a circuit that requires less area and power to multiply a reference frequency by a small integer. A further advantage is that the frequency-multiplying network may be include passive elements, such as the stages that generate the multiple phases. The AC coupling and matched resistive voltage dividers can be used to improve the DC performance of a poly-phase filter. Additionally, the use of a differential XOR gate improves noise rejection and zero crossing detection.

Embodiments of the present invention may be used in various semiconductors, memories, processors, controllers, integrated circuits, logic or programmable logic, clock circuits, communications devices, and the like.

It is understood that the term "transistor" or "switch" as used herein includes any switching element which can include, for example, n-channel or p-channel CMOS transistors, MOSFETs, FETs, JFETS, BJTs, or other like switching element or device. The particular type of switching element used is a matter of choice depending on the particular application of the circuit, and may be based on factors such as power consumption limits, response time, noise immunity, fabrication considerations, etc. Hence while embodiments of the present invention are described in terms of p-channel and n-channel transistors, it is understood that other switching devices can be used, or that the invention may be implemented using the complementary transistor types.

While the methods disclosed herein have been described and shown with reference to particular operations performed in a particular order, it will be understood that these operations may be combined, sub-divided, or re-ordered to form equivalent methods without departing from the teachings of the present invention. Accordingly, unless specifically indicated herein, the order and grouping of the operations is not a limitation of the present invention.

It should be appreciated that reference throughout this specification to "one embodiment" or "an embodiment" or "one example" or "an example" means that a particular feature, structure or characteristic described in connection with the embodiment may be included, if desired, in at least one embodiment of the present invention. Therefore, it should be appreciated that two or more references to "an embodiment" or "one embodiment" or "an alternative embodiment" or "one example" or "an example" in various portions of this specification are not necessarily all referring to the same embodiment. Furthermore, the particular features, structures or characteristics may be combined as desired in one or more embodiments of the invention.

It should be appreciated that in the foregoing description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed inventions require more features than are expressly recited in each claim. Rather, as the following claims reflect, inventive aspects lie in less than all features of a single foregoing disclosed embodiment, and each embodiment described herein may contain more than one inventive feature.

What is claimed is:

1. A circuit, comprising:
    a reference clock providing a reference clock signal operating at a reference frequency; and
    a poly-phase frequency multiplier coupled with the reference clock signal, the poly-phase frequency multiplier providing an output signal with an output frequency that is a multiple M of the reference frequency, the poly-phase frequency multiplier having:
        an input bias stage,
        a poly-phase filter stage generating a plurality of phases of the reference clock signal, the plurality of phases numbering 2*M phases separated by a phase difference of 360/(2*M) degrees, and
        a logic stage configured to receive the 2*M phases from the poly-phase filter stage and generate the output signal having the output frequency therefrom.

2. The circuit of claim 1, wherein the reference clock signal is a sinusoidal signal.

3. The circuit of claim 1, wherein the reference clock signal is a differential signal.

4. The circuit of claim 1, wherein the input bias stage includes at least one coupling capacitor for receiving the reference clock signal.

5. The circuit of claim 1, wherein the input bias stage has at least one resistor divider for offsetting the reference clock signal to a DC offset level.

6. The circuit of claim 1, wherein the poly-phase filter stage includes a first stage for generating at least two signals from the reference clock signal, the at least two signals including a first signal that is derived from the reference clock signal, and a second signal that is derived from reference clock signal and is shifted in phase by a first amount relative to the first signal.

7. The circuit of claim 6, wherein the at least two signals includes a third signal that is derived from the reference clock signal and is shifted in phase by a second amount, and a fourth signal that is derived from the reference clock signal and is shifted in phase by a third amount.

8. The circuit of claim 6, wherein the poly-phase filter stage includes a second stage for further filtering the at least two signals of the first poly-phase filter stage.

9. The circuit of claim 1, wherein the logic stage includes one or more exclusive-OR gates.

10. The circuit of claim 1, further comprising:
    a frequency divider receiving the output signal of the poly-phase frequency multiplier and providing a divided signal output having a frequency that is a fraction of the frequency of the output signal.

11. A circuit for multiplying a frequency of a reference signal, comprising:
    an input bias stage coupled with the reference signal and generating a biased reference signal;
    a filter stage receiving the biased reference signal, the filter stage generating a plurality of delayed signals derived from the reference signal;
    and a logic stage receiving the plurality of delayed signals and generating an output signal having an output frequency that is a multiple M of the frequency of the reference signal:
    wherein said plurality of delayed signals are 2*M signals each separated by a phase difference of 360/(2*M) degrees.

12. The circuit of claim 11, wherein the reference signal is a differential sinusoidal signal.

13. The circuit of claim 11, wherein the input bias stage includes at least one coupling capacitor for receiving the reference signal.

14. The circuit of claim 11, wherein the input bias stage has at least one resistor divider for offsetting the reference signal to a DC offset level.

15. The circuit of claim 11, wherein the filter stage includes a first filter stage for generating at least two signals from the reference signal, the at least two signals including a first signal that is derived from the reference signal, and a second signal that is derived from reference signal and is shifted in phase by a first amount relative to the first signal.

16. The circuit of claim 15, wherein the at least two signals includes a third signal that is derived from the reference signal and is shifted in phase by a second amount, and a fourth signal that is derived from the reference signal and is shifted in phase by a third amount.

17. The circuit of claim 15, wherein the filter stage includes a second filter stage for further filtering that at least two signals of the first filter stage.

18. The circuit of claim 11, wherein the logic stage includes one or more exclusive-OR gates.

19. The circuit of claim 11, further comprising:
    a frequency divider receiving the output signal of the poly-phase frequency multiplier and providing a divided signal output having a frequency that is a fraction of the frequency of the output signal.

20. A method for multiplying a frequency of a reference signal by a multiple M, comprising:
    receiving a reference signal from a reference signal source;
    generating multiple versions of the reference signal numbering 2*M at a frequency multiplier coupled to the reference signal source, each of said multiple versions having a different phase 360/(2*M) degrees than at least two others of said multiple versions; and
    combining said multiple versions of the reference signal to form an output signal having a frequency that is the multiple M of the frequency of the reference signal.

* * * * *